(12) United States Patent
Chang et al.

(10) Patent No.: US 10,867,116 B2
(45) Date of Patent: Dec. 15, 2020

(54) FORECASTING WAFER DEFECTS USING FREQUENCY DOMAIN ANALYSIS

(71) Applicant: Taiwan Semiconductor Manufacturing Co., Ltd., Hsin-Chu (TW)

(72) Inventors: Yang-Hung Chang, Taipei (TW); Che-Yuan Sun, Hualien (TW); Chih-Ming Ke, Hsinchu (TW); Chun-Ming Hu, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/719,381

(22) Filed: Dec. 18, 2019

(65) Prior Publication Data

US 2020/0125785 A1    Apr. 23, 2020

Related U.S. Application Data

(63) Continuation of application No. 16/042,468, filed on Jul. 23, 2018, now Pat. No. 10,521,548, which is a continuation of application No. 15/386,818, filed on Dec. 21, 2016, now Pat. No. 10,031,997.

(60) Provisional application No. 62/427,557, filed on Nov. 29, 2016.

(51) Int. Cl.
| | | |
|---|---|---|
| *G06F 30/00* | (2020.01) | |
| *G06F 30/398* | (2020.01) | |
| *G01R 31/28* | (2006.01) | |
| *G01R 31/307* | (2006.01) | |
| *G06T 7/00* | (2017.01) | |

(52) U.S. Cl.
CPC ........ *G06F 30/398* (2020.01); *G01R 31/287* (2013.01); *G01R 31/307* (2013.01); *G06T 7/0004* (2013.01); *G01R 31/2894* (2013.01); *G06T 2207/20056* (2013.01); *G06T 2207/30148* (2013.01)

(58) Field of Classification Search
CPC ............................ G06F 30/398; G01R 31/287
USPC ........................................................ 716/112
See application file for complete search history.

(56) References Cited

U.S. PATENT DOCUMENTS

| | | | |
|---|---|---|---|
| 7,271,608 B1 | 9/2007 | Vermeire et al. | |
| 2007/0050749 A1 | 3/2007 | Ye et al. | |
| 2008/0143316 A1* | 6/2008 | Nara | G01R 13/0263 324/76.19 |
| 2008/0249743 A1* | 10/2008 | Hirohata | G01R 31/2803 702/181 |
| 2008/0294281 A1* | 11/2008 | Shimshi | G06Q 10/04 700/110 |
| 2009/0063378 A1 | 3/2009 | Izikson | |
| 2009/0265155 A1* | 10/2009 | Yokogawa | G06F 30/398 703/14 |

(Continued)

*Primary Examiner* — Suchin Parihar
(74) *Attorney, Agent, or Firm* — Haynes and Boone, LLP

(57) ABSTRACT

Defect information obtained from a test wafer is received. The test wafer was fabricated according to an Integrated Circuit (IC) design layout. A plurality of first regions of interest (ROIs) is received based on the defect information. The first ROIs each correspond to a region of the IC design layout where a wafer defect has occurred. A frequency domain analysis is performed for the first ROIs. A wafer defect probability is forecast for the IC design layout based at least in part on the frequency domain analysis.

20 Claims, 6 Drawing Sheets

(56) References Cited

U.S. PATENT DOCUMENTS

| | | | |
|---|---|---|---|
| 2011/0025839 A1* | 2/2011 | Trupke | G01N 21/63 |
| | | | 348/87 |
| 2011/0188734 A1 | 8/2011 | Tsuchiya et al. | |
| 2013/0304399 A1* | 11/2013 | Chen | G06T 7/12 |
| | | | 702/40 |
| 2013/0336573 A1* | 12/2013 | Dalla-Torre | G06T 7/001 |
| | | | 382/145 |
| 2014/0266238 A1* | 9/2014 | Furse | G01R 31/11 |
| | | | 324/533 |
| 2015/0241511 A1* | 8/2015 | Bickford | H01L 22/20 |
| | | | 702/117 |
| 2016/0012579 A1* | 1/2016 | Shi | G01N 21/956 |
| | | | 382/149 |
| 2016/0109376 A1* | 4/2016 | Pavani | G01B 11/26 |
| | | | 356/237.5 |
| 2016/0116419 A1* | 4/2016 | Pavani | G01N 21/9501 |
| | | | 348/87 |
| 2016/0341791 A1* | 11/2016 | Duffy | G01R 31/305 |
| 2017/0206650 A1 | 7/2017 | Kulkarni et al. | |
| 2017/0309008 A1* | 10/2017 | Shi | G03F 7/705 |
| 2017/0309088 A1* | 10/2017 | Arya | G01R 31/382 |
| 2019/0056655 A1* | 2/2019 | Ekinci | G01N 21/95607 |

* cited by examiner

FORECASTING WAFER DEFECTS USING FREQUENCY DOMAIN ANALYSIS

PRIORITY DATA

This application is a continuation of U.S. patent application Ser. No. 16/042,468, filed Jul. 23, 2018, which is a continuation of U.S. patent application Ser. No. 15/386,818, filed Dec. 21, 2016, now U.S. Pat. No. 10,031,997, issued Jul. 24, 2018, which claims benefit of U.S. Provisional Application No. 62/427,557, filed Nov. 29, 2016, all of which are herein incorporated by reference in their entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

Part of the challenge of semiconductor fabrication is how to accurately and efficiently forecast defects. After lithography masks are produced according to an IC design layout, test wafers may be produced, and then wafer defects are identified based on the test wafer. These wafer defects can be traced back to the IC layout, which may be used to predict potential wafer defect locations during mass production. Knowing the location and/or type of these wafer defects ahead of mass production allows corrective measures to be taken to fix the problems that lead to the defects, which will help prevent device failures, improve yield, and reduce costs. However, existing methods of identifying defects and forecasting wafer defect locations are not very effective or accurate yet. For example, conventional wafer defect forecasting methods may still involve too much "guess work."

Therefore, while existing defect identification and forecasting in IC fabrication have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
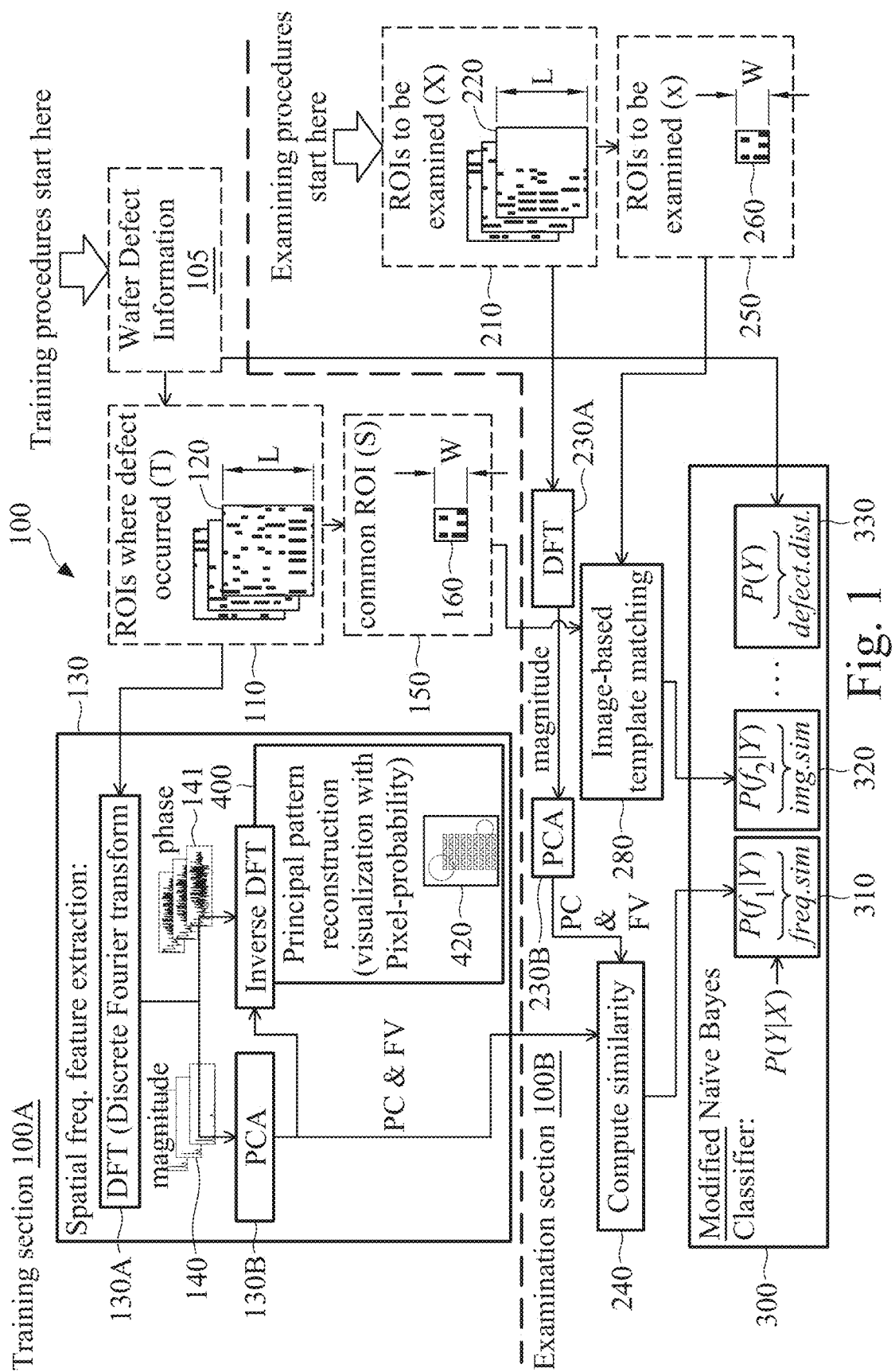
FIG. 1 illustrates a process flow of forecasting wafer defects according to various embodiments of the present disclosure.

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

After a semiconductor device such as an integrated circuit has been designed, layout engineers will generate an IC layout (also referred to as IC layout design or IC layout plan) of the integrated circuit. The IC layout may contain a plurality of different layout layers that each contain a plurality of semiconductor features. These semiconductor features may include transistors, metal lines, vias, capacitors, inductors, diodes, or other microelectronic components that need to function correctly for the IC to operate in a desired manner. In some embodiments, the IC layout is in the form of a Graphic Database System (GDS) file, which is a binary format file that represents various planar shapes (e.g., IC features), text labels, or other information about the IC layout in a hierarchical form. The IC layout is then patterned onto one or more blank reticles, so that the patterned reticle can be used in photolithography processes later to transfer the IC layout onto a semiconductor wafer. The patterned reticles are also referred to as IC masks.

Before mass production begins, a test wafer may be manufactured according to the IC masks. Defects are then identified from the test wafer, and images may be taken for the defects. Based on these defect images, semiconductor fabrication engineers will attempt to determine which areas of the IC design layout are likely to be problematic (e.g., containing a lot of defects). These defect-prone areas may be referred to as a defect minefield. However, forecasting defect minefields have not been easy using existing methods. Often times, engineers employ a trial-and-error approach—which involves a great amount of guesswork—to go through numerous regions of interest (ROI) in an IC layout to perform the defect minefield forecasting. Not only is this time-consuming, it is also inaccurate. Thus, conventional wafer defect forecasting needs to be improved.

The present disclosure overcomes these problems by conducting a frequency domain analysis on the wafer defect images. Based on the frequency domain analysis, principal components are identified and extracted based on their magnitude alone (and not including phase). This allows engineers to disregard things such as rotation of the IC layout patterns and/or locational offsets, which should be considered noise and should be filtered out. Thus, the frequency domain analysis can be used to characterize one or more a plurality of regions of interest (ROIs) corresponding to a type of wafer defect. The IC layout is also divided into a plurality of ROIs, and each of the ROIs is also analyzed in the frequency domain and then compared with the results of the frequency domain analysis used to characterize the wafer defect. Using a Modified Naive-Bayes classifier, the present disclosure can effectively forecast the probability that each ROI may contain a defect. If a particular ROI is then determined to be a defect-heavy minefield, that ROI can be examined/analyzed in detail further, and the layout design may be tweaked to minimize the occurrence of defects. The various aspects of the present disclosure are now discussed below in more detail with reference to FIGS. 1-6.

Referring now to FIG. 1, a process flow 100 of forecasting wafer defects is illustrated. The process flow 100 includes a training section 100A and an examination section 100B. The purpose of the training section 100A is to identify one or more common characteristics of ROIs that all contain the same defect(s). Once these common characteristics are identified, they can be used to examine different ROIs in an IC design layout in the examination section 100B. The purpose of the examination section 100B is to identify the defect minefields and to forecast the probability that any particular type of defect is likely to occur within any of the examined ROIs.

At the start of the training section 100A, a step 105 is performed, in which wafer defect information is received. For example, a test wafer may be manufactured according to the IC layout design. Defect information is then obtained from the manufactured test wafer, for example by taking images (e.g., via a scanning electron microscope) of the test wafer and examining the images.

The results of the step 105 may be sent to the step 110. In step 110, a plurality of ROIs 120 is received. The ROIs 120 may be defined (e.g., the sizes of the ROIs 120) based on the wafer defect information obtained in step 105. The ROIs 120 are also sorted into different groups. Within each group, the ROIs 120 share enough similarities such that they may be considered to be related, in the sense that they may share a common defect feature.

Figure 2:
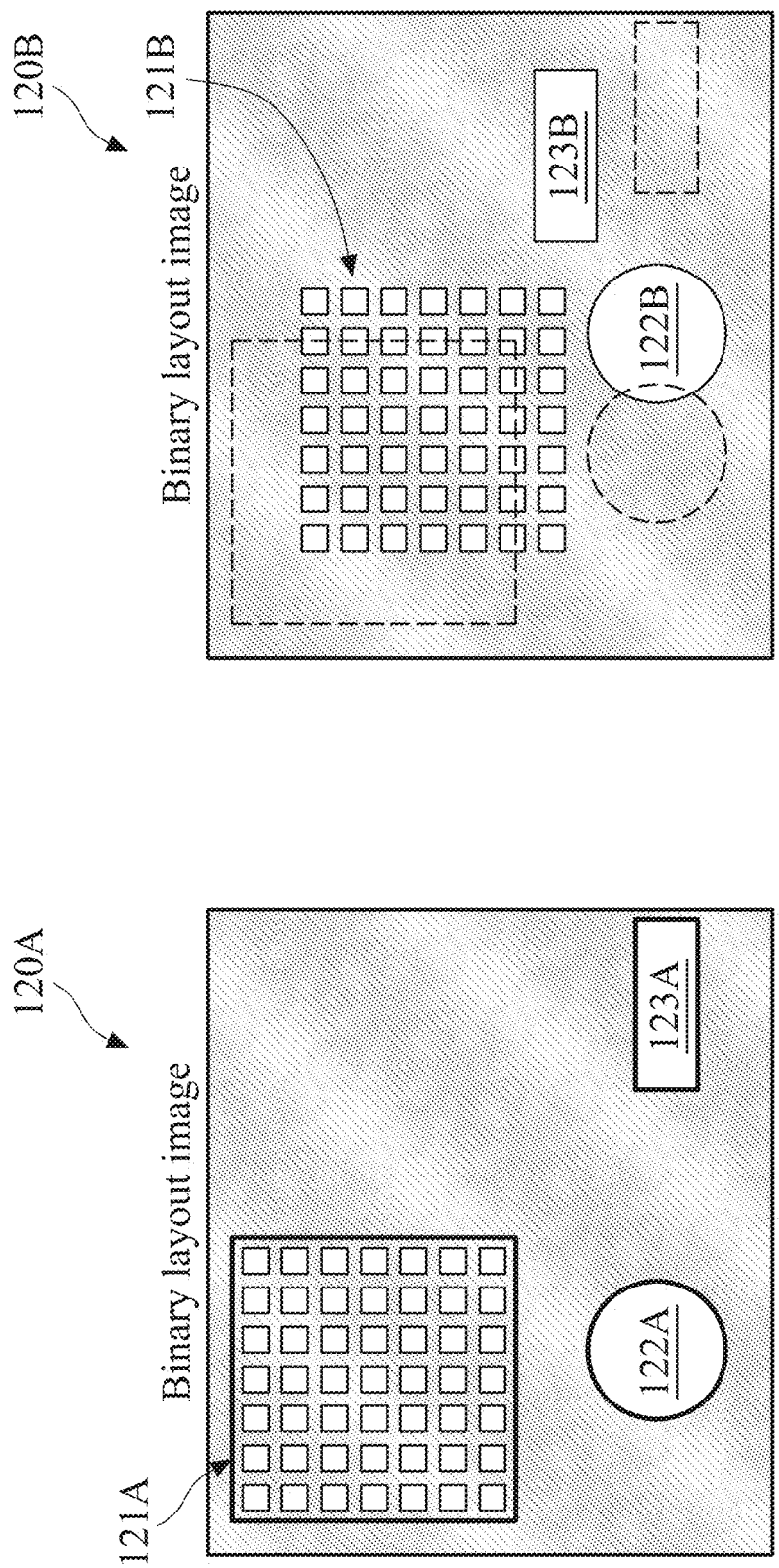
FIG. 2 illustrates binary layout image of two simplified regions of interest (ROI) according to various embodiments of the present disclosure.

For example, referring to FIG. 2, the binary layout image of two simplified ROIs 120A and 120B are illustrated. The ROI 120A contains IC layout patterns 121A (e.g., a plurality of rectangular features), 122A (a rounded feature), and 123A (an elongated feature). The ROI 120B contain IC layout patterns 121B, 122B, and 123B that substantially correspond to the IC layout patterns 121A, 122A, and 123A, respectively. However, the locations of the IC layout patterns 121B/122B/123B are shifted with respect to the IC layout patterns 121A/122A/123A. The locations/boundaries of the IC layout patterns 121B/122B/123B are illustrated as broken lines in the ROI 120B for an easy visual comparison of the differences between the ROIs 120A and 120B.

Due to the locational offsets of the various IC layout patterns 121B/122B/123B, conventional methods may not consider the ROI 120B to be related to (or correlated with) the ROI 120A. One reason is that the conventional methods typically only perform an image-based comparison to see if the features/patterns in the two ROIs match up. By doing so, conventional methods may conclude (incorrectly) that the ROI 120B is quite different from the ROI 120A, since their image patterns do not match up exactly.

However, the present disclosure recognizes that the locational offsets between the various IC layout patterns should not affect the correlation between different ROIs much. In the illustrated example shown in FIG. 2, the ROIs 120A and 120B include substantially similar IC layout patterns, and the relative locational offsets between these IC layout patterns do not mean that the ROIs 120A and 120B are unrelated to one another. Thus, the present disclosure still considers these ROIs 120A and 120B to belong to the same group of ROIs. In some embodiments, the grouping of common ROIs may be performed using a technique known as Process Window Qualification (PWQ). This may involve using a wafer inspection tool to inspect a plurality of spots (e.g., a million spots), and then using an inspection software hotspot pattern analysis (HPA) tool to complete the grouping of the ROIs.

Once the ROIs 120 are grouped into a plurality of subsets, within any given group (or subset) of ROIs 120, it may be said that a common characteristic of a wafer defect may be determined based on a frequency domain analysis, which will be discussed in more detail below.

Referring back to FIG. 1, the ROIs 120 in the illustrated embodiment are in the form of squares. Each side of the square has a size L. Compared to conventional ROIs, the size L may be significantly larger. In some embodiments, L is in a range between 0.7 microns (um) and 3 microns. The reason that the ROIs 120 can have the larger size L is also because the present disclosure characterizes the ROIs 120 via a frequency domain analysis, rather than just an image-based comparison (done in conventional wafer defect forecasting).

In more detail, setting the size of ROIs is often times tricky using conventional methods. On the one hand, setting a larger ROI size means that too much background (and irrelevant) IC pattern information may come in, and thus it may be more difficult to find an exact match between the different ROI images. In addition, many ROIs that should be considered related to one another (such as the ROIs 120A and 120B discussed above with reference to FIG. 2) would not have yielded a match. On the other hand, setting a smaller ROI size means that the image-based template matching process would yield too many matches. What to do with these matches would be a time consuming and cumbersome process. This is often the dilemma facing the conventional defect forecasting processes. As such, it may be said that the image-based template matching technique used in conventional methods is not optimal in wafer defect forecasting.

In comparison, the present disclosure uses frequency domain information to determine the ROI matching, which allows the ROI size to be set relatively large. Referring back to FIG. 1, the frequency domain analysis is done in a step 130 of the training section 100A to transform the layout information contained in the ROIs 120 into information in the frequency domain. In more detail, the step 130 performs a Fourier Transform, for example a Discrete Fourier Transform (DFT) in sub-step 130A. The sub-step 130A is performed using a given group of ROIs 120 as its input. For example, the IC layout information included in the group of ROIs (that are deemed to be related, such as the ROIs 120A and 120B discussed above) is sent as input for the step 130A.

The Fourier Transform produces the frequency domain information for each of the ROIs 120 that was sent as the input. For example, it reveals the distribution of spatial frequency associated with the ROI that is processed. As shown in FIG. 1, the frequency domain information includes a magnitude component 140 and a phase component 141. The magnitude component 140 holds the information of "frequency distribution". For example, the magnitude component 140 may correspond to the shapes and sizes of the various IC layout patterns in each ROI. In comparison, the phase component 141 holds the information of "position in space coordinate." For example, the phase component may correspond to the locations of the various IC layout patterns. As discussed above with reference to FIG. 2, the relative locations of the IC layout patterns should not be a meaningful consideration in determining defects. As such, the phase component 141 produced by the sub-step 130A is disregarded, at least temporarily. The phase component 141 may be used later for a back projection process to reconstruct a weighted sonar image of the ROI, and this will be discussed below in more detail.

Meanwhile, the magnitude component 140 is processed in sub-step 130B of the step 130 as a part of a Principal Component Analysis (PCA). PCA is a statistical procedure that uses an orthogonal transformation to convert a set of observations of possibly correlated variables into a set of values of linearly uncorrelated variables, which are called principal components. The number of principal components is less than or equal to the number of original variables. This transformation is defined in such a way that the first principal component has the largest possible variance (that is, accounts for as much of the variability in the data as possible), and each succeeding component in turn has the highest variance possible under the constraint that it is orthogonal to the preceding components. The resulting vectors are an uncorrelated orthogonal basis set.

In some embodiments, the PCA may be performed using compute code, such as using MATLAB code. For example, suppose there are two ROIs A and B (as training images). The PCA may include the following:
freq.spectra of ROIs: FreqDataMatrix=[A B], where A=transpose([a1 a2 a3 ... ]), B=transpose([b1 b2 b3 ... ]).
[u s v]=SVD(FreqDataMatrix), where SVD stands for "singular value decomposition", which is a way to do PCA. The principal components will land on "u". Now, the ROIs A and B may be described using the new principal components as follows:

$$A = FV\_A * PC$$

$$B = FV\_B * PC$$

where PC is the principal component, and where FV_A is a feature vector for A (in other words, the coefficient of the principal component for ROI A), and where FV_B is a feature vector for B (in other words, the coefficient of the principal component for ROI B).

Thus, the result of the PCA performed in sub-step 130B may include a principal component (PC) and a feature vector (FV). This result represents the frequency domain information of the selected group of ROIs 120. Alternatively stated, the selected group of ROIs 120 may be described or characterized with the PC and the FV obtained as a result of the sub-step 130B. In this manner, the PC and FV obtained for any given group of ROIs 120 may be used later (in the examination section 100B discussed below) as a template ROI to help identify other similar ROIs in the IC design layout.

In some embodiments, the principal discrete frequency components of all ROIs 120 are extracted. The number of principal components may be in a range between 1 and 4, for example.

It is understood that the process 130 discussed above may be repeated for a plurality of different groups of ROIs 120. For example, suppose that based on the test wafer defect analysis, 10 different types of defects are identified. Each type of defect may be associated with a different group of ROIs 120, where within each given group of ROIs, there may be any number of individual ROIs that are related/correlated with one another. The step 130 may be repeated 10 different times to produce 10 different sets of PCs and FVs, where each different set of PC and FV represents the frequency domain information of the corresponding group of ROIs. Each set of PC and FV will then be used (in the examination section 100B discussed below) to compare against a plurality of ROIs, in order to determine whether the corresponding type of defect is likely to occur within the ROI.

Although the present disclosure focuses on obtaining the frequency domain information of ROIs, an image-based comparison may also be used to aid the defect probability calculation. As a part of the image-based comparison process, a "smaller" ROI (also referred to as a "template") is obtained first. For example, as a part of the training section 100A, a step 150 is performed to obtain a common ROI 160 (i.e., the template), for each group of ROIs 120. The common ROI or template 160 is a smaller subsection of the "larger" ROI 120.

Figure 3:
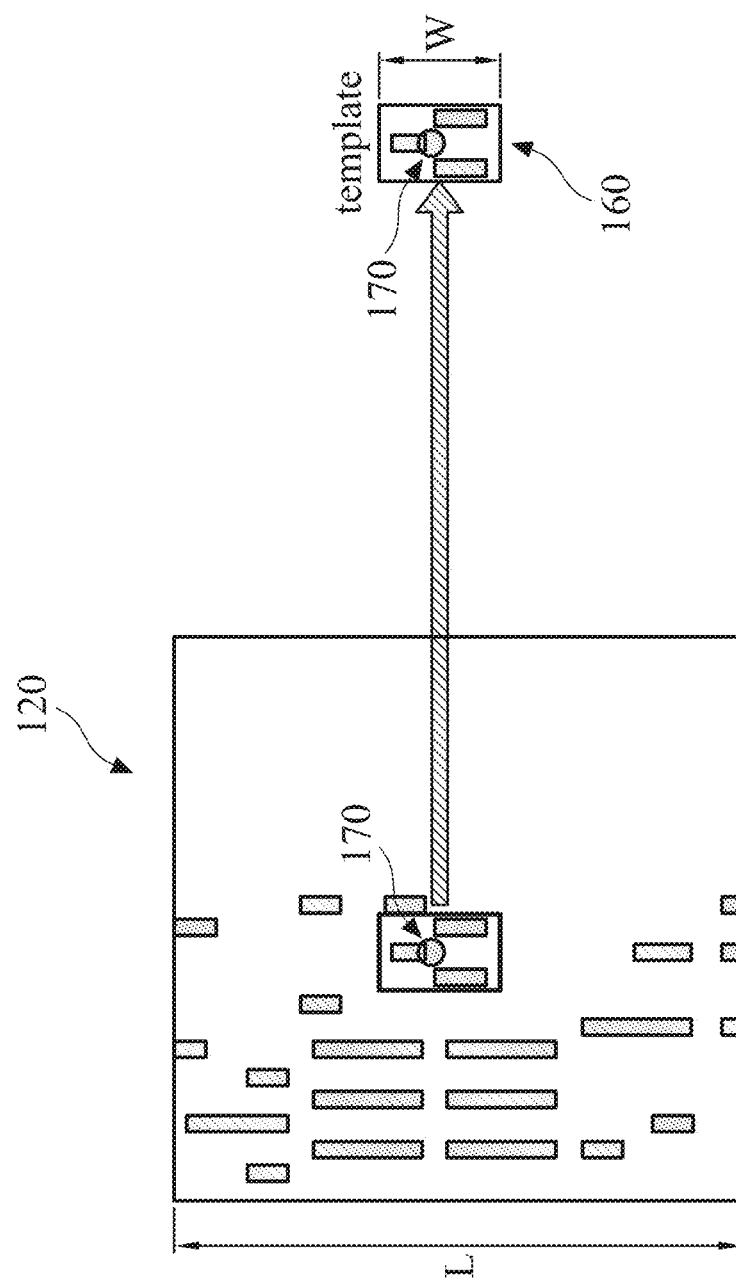
FIG. 3 illustrates the relationship between a "larger" ROI and a "smaller" ROI according to various embodiments of the present disclosure.

An example of the relationship between the "larger" ROI 120 and the "smaller" ROI 160 is visually illustrated in FIG. 3. In FIG. 3, the "larger" ROI 120 includes a plurality of IC layout patterns. A defect 170 is disposed near or adjacent to some of the IC layout patterns. Thus, a smaller "template" 160 can be extracted from the larger ROI 120, where the template 160 includes just the IC layout patterns near the defect 170. It can be seen that the defect 170 is located near a center of both the "larger" ROI 120 and the "smaller" ROI (or template) 160. The smaller ROI 170 may have a dimension W. In some embodiments, W is in a range between 0.3 microns and 0.7 microns, for example 0.5 microns. The larger ROI 120 may have a dimension L, which as discussed above, is larger than W and smaller than 3 microns. Thus, it can be seen that the larger ROI 120 is at least several times as large as the smaller ROI 160, since 0.3 microns≤W≤0.7 microns, and W≤L≤3 microns.

Returning to FIG. 1, it is understood that the smaller 160 will be used to perform an image-based comparison with the ROIs of an IC design layout, to help forecast the defect probability within any given ROI.

Based on the discussions above, it can be seen that the completion of the step 130 in the training section 100A yields the frequency domain information (e.g., in the form of the PC and the FV) of a group of "larger" ROIs 120 as a first result, and the completion of the step 150 in the training section 100A yields the "smaller" ROI (or template) as a second result. These results are now compared with ROIs in the examination section 100B.

In more detail, at the beginning of the examination ("Examination procedures start here" in FIG. 1), a step 210 of the examination section 100B identifies a plurality of ROIs 220 to be examined. The ROIs 220 may be obtained by dividing the IC design layout into a plurality of regions, where each region corresponds to a different one of the ROIs 220. In some embodiments, the ROIs 220 have the same sizes or dimensions as the ROIs 120. For example, the ROIs 220 may each have the dimension L (as the ROIs 120), which as discussed above is in a range between W and 3 microns.

A frequency domain analysis is also performed to the ROIs 220. For example, the ROIs 220 may each undergo a DFT process 230A, which is similar to the DFT process 130A discussed above. As a result of the DFT process 230A for each ROI 220, the frequency domain information for that ROI 220 is obtained. Again, the frequency domain information may include a magnitude component and a phase component (similar to the magnitude component 140 and the phase component 141). The phase component is set aside, while the magnitude component undergoes a PCA process 230B, which is similar to the PCA process 130B discussed above. As a result, a principal component (PC) and a feature vector (FV) are generated for each of the ROIs 220.

In a step 240 of the examination section 100B, a similarity between the frequency domain information of the ROIs 120 and the frequency domain information of the ROIs 220 is determined. In some embodiments, the step 240 may include computing the similarity between the PC and the FV obtained from the step 130B (e.g., the PC and FV of ROIs 120), with the PC and the FV obtained from the step 230B (e.g., the PC and FV of ROIs 220). This computing step may be performed by calculating a cosine similarity, for example. If the calculation yields a negative value below 0, then a value of 0 is used instead for the similarity. If the calculation yields a positive value above 0 (for example between 0 and 1), then that positive value between 0 and 1 is used for the similarity. This result of the step 240 will be used to forecast the defect probability in any given ROI 220, as will be discussed below in more detail.

In addition to determining the similarity between the ROIs 120 and 220, the examination section 100B also performs an image-based matching process. In more detail, a step 250 is performed to obtain an ROI 260 (i.e., a template), for each of the ROIs 220. Similar to the ROI 160 discussed above, the ROI or template 260 is a smaller subsection of the "larger" ROI 220. In some embodiments, the dimensions of the ROI 260 are the same as the dimensions of the ROI 160. The ROI 260 is then compared with the ROI 160 in an image-based template matching process 280. For example, the IC layout patterns contained in the ROI 260 are compared with the IC layout patterns contained in the ROI 160.

It is understood that the process 280 is not a frequency-domain-based analysis (unlike the processes in step 130, for example), but rather a comparison of the two-dimensional planar view of the IC layout patterns themselves. In some embodiments, the image-based template matching process 280 compares the image pixels in the ROI 160 with the image pixels in the ROI 260. The image-based template matching process 280 will yield a binary value of either 0 (i.e., not matched) or 1 (i.e., matched). The matching result (i.e., 0 or 1) of the process 280 will also be used to help forecast the defect probability in any given ROI 220.

Lastly, the examination section 100B includes a step 300 to forecast the defect probability of any given ROI 220 of the IC layout design. In some embodiments, the step 300 is performed using a modified Naive Bayes Classifier. Naive Bayes is a technique for constructing classifiers: models that assign class labels to problem instances, represented as vectors of feature values, where the class labels are drawn from some finite set. It includes algorithms based on a common principle: all naive Bayes classifiers assume that the value of a particular feature is independent of the value of any other feature, given the class variable. Abstractly, naive Bayes is a conditional probability model: given a problem instance to be classified, represented by a vector $X=(x_1, x \ldots, x_n)$ representing some n features (independent variables), it assigns to this instance probabilities: $p(C_k|x_1, x \ldots, x_n)$ for each of K possible outcomes or classes $C_k$.

According to the present disclosure, the Naive Bayes Classifier is expressed as follows:

$$P(Y \mid X) \rightarrow \underbrace{P(f_1 \mid Y)}_{freq.sim} \underbrace{P(f_2 \mid Y)}_{img.sim} \ldots \underbrace{P(Y)}_{defect.dist}.$$

where X represents the ROI on the IC design layout to be examined (e.g., the frequency domain analysis result of the ROI 220), Y represents the occurrence of a wafer defect, $f_1$ represents the similarity computed between the frequency domain analysis results of the ROIs 120 and 220, and $f_2$ represents the matching result between the image-based template matching between the ROIs 160 and 260.

The output of the steps 240 and 280 are sent as inputs to the step 300. Specifically, the output of the step 240 (the computed similarity between the PC and FV of the ROIs 120 and 220) is sent as the input to a component 310 of the step 300, and the output of the step 280 (the matching similarity between the images of ROI 160 and 260) is sent as the input to a component 320 of the step 300.

As discussed above, the output of the step 240 is a value between 0 and 1 (i.e., a percentage). Thus, the component 310 determines that, given the degree of similarity between a given ROI 220 (being examined) and the ROIs 120 (corresponding to a particular type of defect), how likely is that defect to occur in the ROI 220? Again, the similarity comparison was performed in the frequency domain, which eliminates things such as rotations of the layout patterns, insignificant locational offsets between the layout patterns, or other insignificant background noise, etc. The frequency domain analysis results (e.g., the PC and FV) reveal the truly meaningful aspects of the layout patterns in terms of their contribution to wafer defects.

Meanwhile, the output of the step 280 is a binary value between 0 and 1. This is saying that if the ROI 260 can't even match with the small-scaled ROI 160—which is a small scale image matching—then their corresponding larger ROIs 220 and 120 should not be considered matches either. Thus, even if the computed similarity in step 240 is high (e.g., >90%), a binary value of 0 for the step 280 (total mismatch between the images) will still indicate that the ROI 220 should not be considered to be a match for the ROIs 120. In other words, the likelihood of the type of defect corresponding to the ROIs 120 is unlikely to occur in the ROI 220 being examined. On the other hand, if the result of the step 280 is a 1—meaning that the ROI 260 fully matches the ROI 160—then the computed frequency domain similarity between the ROIs 220 and 120 will be meaningful in forecasting a wafer defect probability in the ROI 220. For example, if the result of the step 280 is a 1, and the frequency domain similarity computed in step 240 is 80%, then it can be said that there is an 80% probability that the type of wafer defect corresponding to the ROIs 120 will occur in the ROI 220 being examined.

Another component of the Naive Bayes Classifier in step 300 is the component 330. The component 330 receives the wafer defect distribution data as an input. The wafer defect distribution data is gathered from the step 105 of receiving wafer defect information. Alternatively, the component 330 may be set to always be equal to 1 in some embodiments.

Based on the Naive Bayes Classifier analysis performed in step 300, a wafer defect numerical probability for each type of wafer defect can be forecast or predicted for a given ROI. By repeating the processes discussed above a number of times, the present disclosure can forecast the defect probability for all types of identified defects, and for the entire IC layout design. For example, assuming that 20 types of wafer defects are identified (meaning 20 different types of groupings of the ROIs 120), and that the entire IC layout design has been divided into 3000 different ROIs 220. In that hypothetical scenario, each of the 20 different groups of ROIs (that each correspond to an identified wafer defect) undergoes the frequency domain analysis in the training section 100A to determine what the frequency domain representation of each type of defect looks like. The 3000 ROIs 220 will each be compared to this frequency domain representation of a specific type of defect to see what the probability is for that defect to occur on each ROI 220. As such, there may be 20×3000=60000 frequency domain comparisons in this example. The image-based template comparison is performed in a similar manner.

With these results, the Naive Bayes Classifier in step 300 can predict the numerical probability that a particular type of defect (e.g., defect type number 5 out of the 20 types of defects) will occur for any one of the 3000 ROIs 120 (e.g., ROI number 1732). Once a particular ROI 220 is identified as having a high probability of a wafer defect occurrence, it may be deemed a "defect minefield", and additional diagnoses and remedial measures may be taken to try to identify and fix the problems that may cause the defect. For example, the IC design layout may be revised (e.g., by placing components differently or rerouting certain components), or OPC (optical proximity correction) may be used to minimize the likelihood of defect occurrence.

It is understood that the present disclosure also allows for the construction of a weighted image, where the pixels of the image are each weighted in terms of its importance in causing (or being related to) the defect. This is done through a back projection process 400, which involves using an inverse DFT process to perform a principal pattern reconstruction. As a result, a weighted image 420 is produced that allows for visualization with pixel-probability.

In more detail, the present disclosure recognizes that not every "spot" of the IC design layout is equally as important in causing wafer defects. Translated into images, that means that not every pixel of an ROI image is equally as important in its correlation with defect occurrence within that ROI. An image pixel X located in one area of an ROI may have a higher probability of causing wafer defects than another image pixel Y located in a different area of the ROI. It would be desirable to generate a "heat map", or a "sonar image", where each image pixel is weighted visually to indicate their respective probability in causing the wafer defects.

Figure 4:
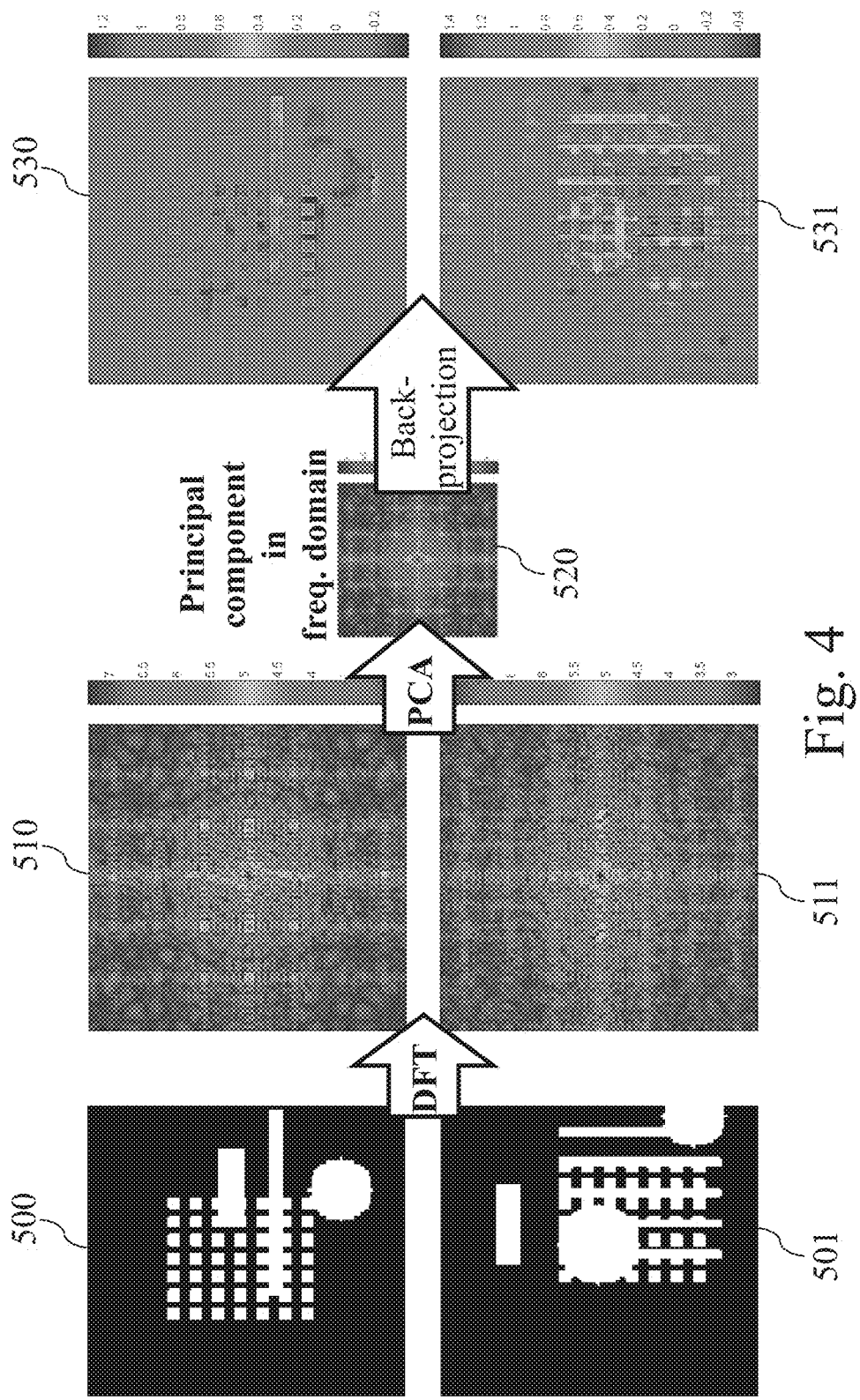
FIG. 4 illustrates a process of constructing weighted ROI images according to various embodiments of the present disclosure.

The present disclosure constructs such weighted images at least in part by using an inverse DFT process. FIG. 4 helps visually illustrate this image construction process. As examples, FIG. 4 shows two images 500 and 501 that represent two different simple ROIs. The images 500-501 are black-and-white images, which means that the various layout patterns (e.g., patterns that have shapes resembling polygons, circles, etc.) contained in these images 500-501 are either black in color or white in color. In a grayscale spectrum (ranging from pixel values from 0 to 255, for example), the white pixels each have a value of 255, and the black pixels each have a value of 0.

The images 500-501 are each processed by undergoing a DFT. As discussed above, the DFT result includes magnitudes and phase components. The magnitude components are illustrated in FIG. 4 as magnitude components 510 and 511 in the frequency domain. The phase components are set aside, while the magnitude components then undergo a PCA process to obtain a principal component in the frequency domain, which is visually represented as element 520 in FIG. 4.

The back projection process is then performed. In the back projection process, an inverse DFT process is performed to the principal component 520 in the frequency domain. This inverse DFT process should produce an image comprising pixels. This image has not taken into account of the phase information yet, so the pixels are not weighted. To properly weigh the pixels, the phase components corresponding to the different images 500-501 are added back in to the images, thereby generating images 530-531 that have the weighted image pixels.

In the grayscale ranging from 0-255 in values, as the pixel's probability of being correlated with the wafer defect increases, the grayscale value of that pixel increases too. For example, an image pixel having a value close to 255 is deemed highly likely to be correlated with the wafer defect (or is important in causing the defect), whereas another image pixel having a value close to 0 is deemed unlikely to be correlated with the wafer defect. Thus, the weighted images 530-531 allows for a quick visual inspection of a given ROI to identify what the problem areas are. Thus, although the construction of the weighted images 530-531 is not required to forecast the wafer defect probability, it does help in diagnosing and correcting the problems that could cause the wafer defect.

Based on the above discussions, it can be seen that the present disclosure offers advantages over conventional systems and methods of forecasting wafer defects. It is understood, however, that other embodiments may offer additional advantages, and not all advantages are necessarily disclosed herein, and that no particular advantage is required for all embodiments.

One advantage is the present disclosure offers a systematic and scientific way to accurately forecast the wafer defects. Conventional wafer defect forecasting processes are typically image-based, which is slow and involves a lot of "guess work." In comparison, the present disclosure uses frequency domain analysis to filter out the "noise" and identify the truly important characteristics of the ROIs that correspond to wafer defects. The different regions of an IC design layout—each corresponding to an ROI—is then compared with the ROI that has been identified as containing wafer defects, so as to systematically go through each ROI to determine the probability of wafer defect occurrence therein. This process involves no guess work and is therefore accurate and reliable.

Another advantage is that the ROIs can be made to be bigger than in previous forecasting methods. As discussed above, conventional wafer defect forecasting is done using image-based comparisons. If an ROI is made to be big, then it is difficult to find a match—other ROIs that should be considered matches are incorrectly filtered out due to irrelevant background environmental information not matching up between the ROIs, or due to locational offsets or rotations between the patterns in the ROIs. The present disclosure does not have this problem, because the information regarding the ROIs are transformed in the frequency domain, and principal component analysis is also performed on the magnitude portion (but not the phase portion) of the frequency domain information, so as to identify the dominant characteristics of the ROIs. Thus, the ROIs can be made to be big, since the irrelevant background environmental information (considered noise) can be filtered out. Similarly, the locational displacements and rotations of the patterns also can be filtered out, since they will not impact the frequency-domain based analysis discussed in the present disclosure.

Yet another advantage is the construction of the weighted image to provide a visual landscape of the problematic layout areas. For example, in the back projection process discussed above, an image corresponding to an ROI can be generated, where each pixel is weighted (e.g., in a grayscale) according to its importance in causing the wafer defect. When the weighted image is viewed as a whole, the defect hotspots can be quickly identified just by visual inspection, and then subsequent remedial measures may be taken to address the problems that cause the wafer defect.

Figure 5:
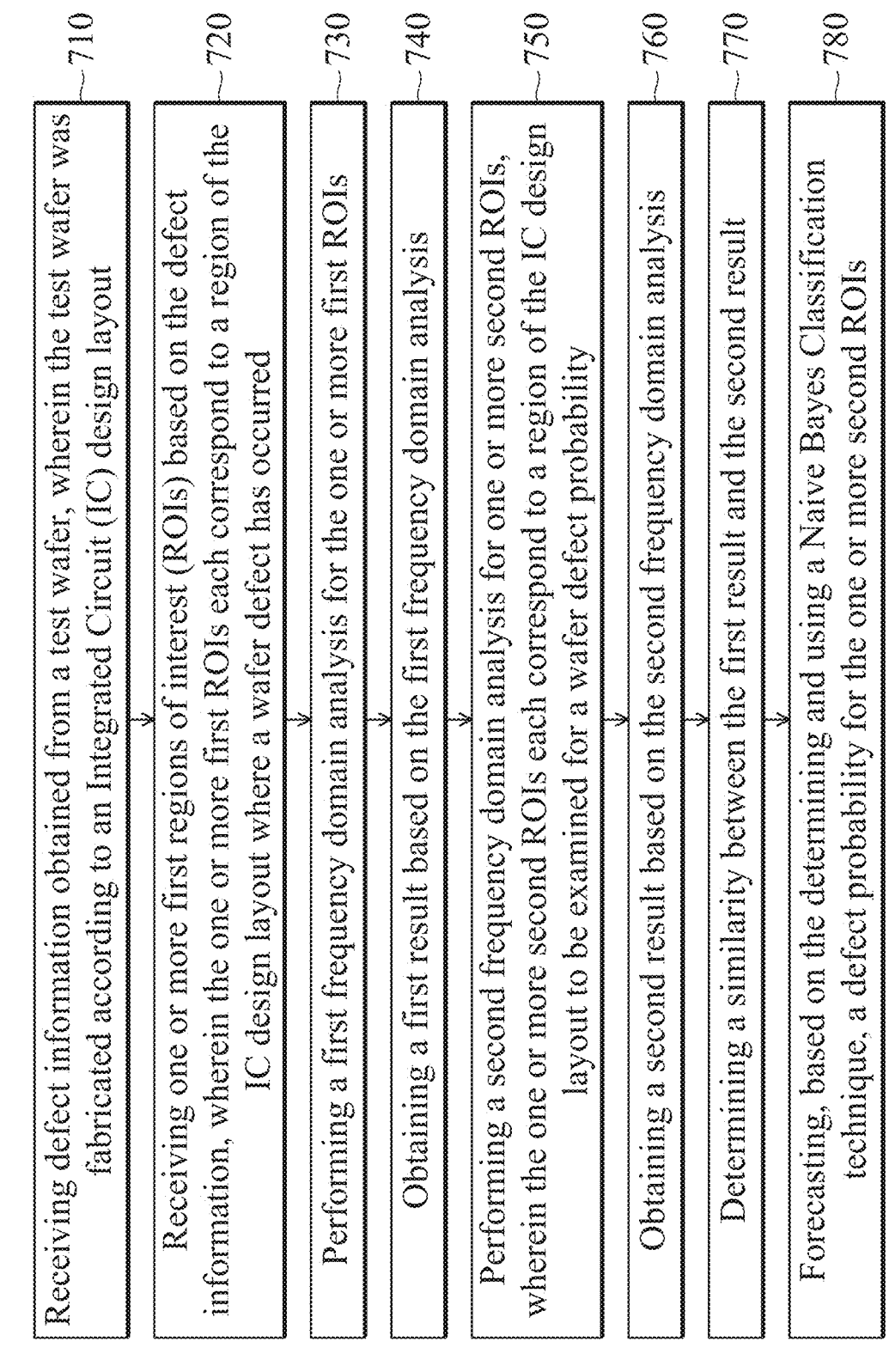
FIG. 5 illustrates a flow chart of a method of forecasting wafer defects in accordance with embodiments of the present disclosure.

FIG. 5 is a flowchart of a method 700 for forecasting wafer defects in accordance with various aspects of the present disclosure. The method 700 includes a step 710 of receiving defect information obtained from a test wafer. The test wafer was fabricated according to an Integrated Circuit (IC) design layout.

The method 700 includes a step 720 of receiving one or more first regions of interest (ROIs) based on the defect information. The one or more first ROIs each correspond to a region of the IC design layout where a wafer defect has occurred.

The method 700 includes a step 730 of performing a first frequency domain analysis for the one or more first ROIs.

The method 700 includes a step 740 of obtaining a first result based on the first frequency domain analysis.

The method 700 includes a step 750 of performing a second frequency domain analysis for one or more second ROIs. The one or more second ROIs each correspond to a region of the IC design layout to be examined for a wafer defect probability.

The method 700 includes a step 760 of obtaining a second result based on the second frequency domain analysis.

The method 700 includes a step 770 of determining a similarity between the first result and the second result.

The method 700 includes a step 780 of forecasting, based on the determining and using a Naive Bayes Classification technique, a defect probability for the one or more second ROIs.

In some embodiments, the performing of the first frequency domain analysis and the performing of the second frequency domain analysis each comprises: performing a Discrete Fourier Transform to generate both magnitude information and phase information; performing a Principal Component Analysis (PCA) using the magnitude information but not the phase information; and extracting, based on the PCA, a first principal component and a first feature vector as the first result and a second principal component and a second feature vector as the second result.

It is understood that additional process steps may be performed before, during, or after the steps 710-780 discussed above to complete the fabrication of the semiconductor device. For example, the method 700 may further include a step of, before the forecasting: receiving a plurality of third ROIs based on the defect information. Each of the third ROIs corresponds to a selected area of a respective one of the first ROIs. An image-based matching process is then performed between the first ROIs and one or more fourth ROIs. Each of the one or more fourth ROIs corresponds to a selected area of a respective one of the second ROIs. The forecasting is performed at least in part based on the image-based matching process. In some embodiments, the forecasting is further performed at least part based on the received defect information. In some embodiments, each of the first ROIs has a same size as each of the second ROIs, and each of the third ROIs has a same size as each of the fourth ROIs. As another example, the method 700 may further include a step of: generating, at least in part by performing an inverse Discrete Fourier Transform (DFT), a weighted image corresponding to one of the first ROIs. The weighted image contains a plurality of pixels each weighted based on its correlation with the wafer defect. Other process steps are not discussed herein for reasons of simplicity.

Figure 6:
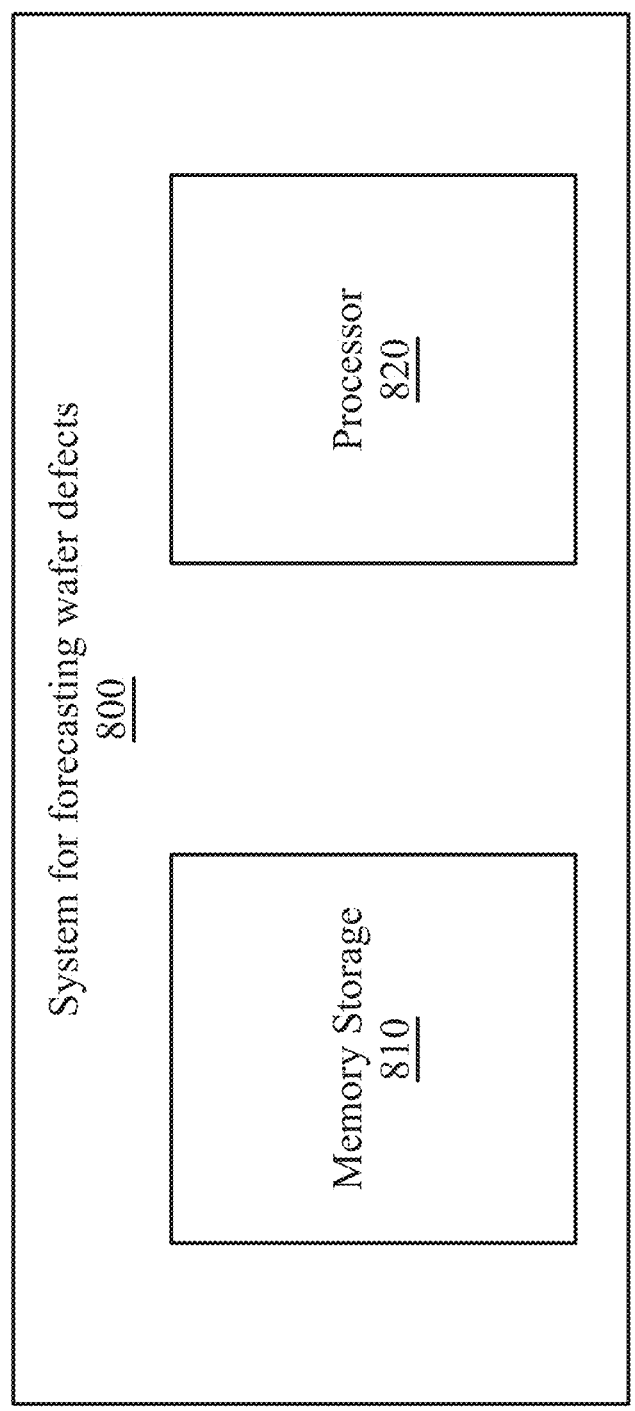
FIG. 6 illustrates a machine that is configured to perform the wafer defect forecasting in accordance with embodiments of the present disclosure.

FIG. 6 is a simplified diagrammatic view of a system 800 for performing the various steps of the present disclosure (e.g., frequency domain analysis and wafer defect forecasting) as discussed above with reference to FIGS. 1-5. In some embodiments, the system 800 is a machine that includes a non-transitory computer-readable medium, for example a memory storage component 810, that stores executable programming instructions. The system 800 may also include a processor component 820 that executes the executable programming instructions stored in the memory storage component 810. The executed instructions allow the processor component 820 to forecast wafer defects, for example according to the method 700 discussed above in FIG. 5.

One aspect of the present disclosure involves a method of forecasting wafer defects. Defect information obtained from a test wafer is received. The test wafer was fabricated according to an Integrated Circuit (IC) design layout. A plurality of first regions of interest (ROIs) is received based on the defect information. The first ROIs each correspond to a region of the IC design layout where a wafer defect has occurred. A frequency domain analysis is performed for the first ROIs. A wafer defect probability is forecast for the IC design layout based at least in part on the frequency domain analysis.

Another aspect of the present disclosure involves a method of forecasting wafer defects. Defect information obtained from a test wafer is received. The test wafer was fabricated according to an Integrated Circuit (IC) design layout. One or more first regions of interest (ROIs) is received based on the defect information. The one or more first ROIs each correspond to a region of the IC design layout where a wafer defect has occurred. A first frequency domain analysis is performed for the one or more first ROIs. A first result is obtained based on the first frequency domain analysis. A second frequency domain analysis is performed for one or more second ROIs, wherein the one or more second ROIs each correspond to a region of the IC design layout to be examined for a wafer defect probability. A second result is obtained based on the second frequency domain analysis. A similarity between the first result and the second result is determined. Based on the determining and using a Naive Bayes Classification technique, a defect probability is forecast for the one or more second ROIs.

Another aspect of the present disclosure involves a method for forecasting wafer defects. Defect information is obtained from a test wafer is received. The test wafer was fabricated according to an Integrated Circuit (IC) design layout. One or more first regions of interest (ROIs) is received based on the defect information. The one or more first ROIs each correspond to a region of the IC design layout where a wafer defect has occurred. A first frequency domain analysis is performed for the one or more first ROIs. The first frequency domain analysis comprises a Discrete Fourier Transform (DFT) and a Principal Component Analysis (PCA). A first principal component and a first feature vector are obtained as a result of the first frequency domain analysis. A second frequency domain analysis is performed for one or more second ROIs. The one or more second ROIs each correspond to a region of the IC design layout to be examined for a wafer defect probability. The first frequency domain analysis also comprises the DFT and the PCA. A second principal component and a second feature vector are obtained as a result of the second frequency domain analysis. A similarity is computed between the first and second principal components and the first and second feature vectors. Based on the computed similarity, a defect probability is forecast for the one or more second ROIs. The forecasting is performed at least in part using a Naive Bayes Classification technique.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    performing a training process, the training process including:
        accessing wafer defect information of a wafer that has undergone semiconductor fabrication;
        identifying, based on the accessing of the wafer defect information, one or more first regions of interest (ROIs) that contain one or more same defects as one another; and
        determining a first characteristic that is common to all the first ROIs; and
    performing an examination process on an integrated circuit (IC) design layout of the wafer, wherein the performing the examination process comprises:
        dividing the IC design layout into a plurality of second ROIs;
        determining a second characteristic of each of the second ROIs;
        comparing the first characteristic with the second characteristic for each of the second ROIs; and
        evaluating, based on the comparing, a probability of an occurrence of the one or more same defects within each of the second ROIs.

2. The method of claim 1, wherein the evaluating is performed at least in part using a Naive Bayes technique.

3. The method of claim 1, wherein each of the second ROIs has a same size as each of the first ROIs.

4. The method of claim 1, wherein the first characteristic and the second characteristic each contain frequency domain information.

5. The method of claim 4, further comprising: performing a Discrete Fourier Transform to the first ROIs and the second ROIs to obtain the frequency domain information.

6. The method of claim 1, wherein:
    the determining the first characteristic comprises determining a first magnitude component and a first phase component of a first frequency domain information of the first ROIs;
    the determining the second characteristic comprises determining a second magnitude component and a second phase component of a second frequency domain information of the second ROIs; and
    the comparing comprises comparing a similarity between the first magnitude component and the second magnitude component.

7. The method of claim 6, wherein the comparing is performed without using the first phase component or the second phase component.

8. The method of claim 6, wherein the comparing comprises calculating a cosine similarity.

9. The method of claim 6, wherein the first magnitude component and the second magnitude component each include a respective principal component (PC) and a respective feature vector (FV).

10. A method, comprising:
    identifying, based on wafer defect information corresponding to a fabricated wafer, a plurality of first regions, wherein one or more same defects occurred on each of the first regions;
    determining a first characteristic for the first regions;
    dividing an integrated circuit (IC) design layout of the wafer into a plurality of second regions;
    determining a second characteristic for the second regions;
    comparing the first characteristic with the second characteristic; and
    predicting, based on the comparing, a probability of occurrence of defects for wafers to be fabricated according to the IC design layout.

11. The method of claim 10, wherein the dividing is performed such that each of the second regions has a same size as each of the first regions.

12. The method of claim 10, wherein the predicting comprises predicting the probability of occurrence of defects in each of the second regions.

13. The method of claim 10, wherein:
    the determining the first characteristic comprises determining a first magnitude portion of a frequency domain information of the first regions;
    the determining the second characteristic comprises determining a second magnitude portion of a frequency domain information of the second regions; and
    the comparing comprises comparing the first magnitude portion with the second magnitude portion.

14. The method of claim 10, wherein the predicting is performed at least in part using a Naive Bayes conditional probability model.

15. The method of claim 1, wherein the wafer is a first wafer, and wherein the evaluating is performed for one or more second wafers that have not undergone fabrication yet.

16. The method of claim 10, wherein the comparing comprises calculating a cosine similarity.

17. A system, comprising:
   a non-transitory memory; and
   one or more hardware processors coupled to the non-transitory memory and configured to read instructions from the non-transitory memory to cause the system to perform operations comprising:
      accessing wafer defect information of a first wafer that has undergone semiconductor fabrication;
      identifying, based on the accessing of the wafer defect information, one or more first regions of interest (ROIs) that contain one or more same defects as one another; and
      determining a first characteristic that is common to all the first ROIs;
      examining an integrated circuit (IC) design layout of the first wafer at least in part using the first characteristic; and
      forecasting, based on the examining, a defect for one or more second wafers if the one or more second wafers are fabricated according to the IC design layout.

18. The system of claim 17, wherein the IC design layout includes a plurality of second ROIs, and wherein the examining comprises examining each of the second ROIs using the first characteristic.

19. The system of claim 17, wherein the determining the first characteristic comprises determining a frequency domain characteristic.

20. The system of claim 19, wherein the determining the frequency domain characteristic further comprises: performing a Fourier Transform to the first ROIs.

* * * * *